United States Patent [19]

Andersson et al.

[11] Patent Number: 5,196,723
[45] Date of Patent: Mar. 23, 1993

[54] INTEGRATED CIRCUIT SCREEN ARRANGEMENT AND A METHOD FOR ITS MANUFACTURE

[75] Inventors: Bo S. Andersson, Sundbyberg; Hans T. Lind, Stockholm, both of Sweden

[73] Assignee: Telefonaktiebolaget L M Ericsson, Stockholm, Sweden

[21] Appl. No.: 680,509

[22] Filed: Apr. 4, 1991

[30] Foreign Application Priority Data

Apr. 20, 1990 [SE] Sweden .................. 9001403

[51] Int. Cl.$^5$ ............... H01L 29/40; H01L 27/02; H01L 29/04
[52] U.S. Cl. .................... 257/489; 257/288; 257/505; 257/532; 257/538; 257/539; 257/565
[58] Field of Search ............ 357/53, 52, 35, 51, 357/59 G, 59 H, 59 K

[56] References Cited

U.S. PATENT DOCUMENTS

| | | | |
|---|---|---|---|
| 3,602,782 | 8/1971 | Klein | 317/235 |
| 3,751,722 | 8/1973 | Richman | 317/235 |
| 3,787,717 | 1/1974 | Fischer et al. | 357/53 |
| 4,011,581 | 3/1977 | Kubo et al. | 357/52 |
| 4,321,616 | 3/1982 | Bise | 357/53 |
| 4,430,663 | 2/1984 | D'Altroy et al. | 357/53 |
| 4,613,886 | 9/1986 | Chwang | 357/52 |
| 4,764,800 | 8/1988 | Sander | 357/53 |

OTHER PUBLICATIONS

Relation Between Oxide Thickness and the Breakdown Voltage of a Planar Junction with Field Relief Electrode, V. P. O'Neil & P. G. Alonas, IEEE Trans. on Electron Devices, vol. ED-26, pp. 1098-1100, Jul. 1979.
An Advanced Processing Technology for High Voltage Bipolar IC's M. Roche, Revue De Physique Appliquée, Tome 13, pp. 845-850, Dec. 1978.
"The Design and Electrical Characteristic of High-Performance Single-Poly Ion-Implanted Bipolar Transistors", Denny Duan-Lee Tang et al., IEEE Transactions on Electron Devices, vol. 36, pp. 1703-1710, Sep. 1989.

Primary Examiner—Andrew J. James
Assistant Examiner—Ngan Van Ngo
Attorney, Agent, or Firm—Burns, Doane, Swecker & Mathis

[57] ABSTRACT

An integrated semiconductor circuit includes a substrate, an epitaxial layer having transistor base regions, a first and a second (11) insulating oxide layer, and a protective layer. The first oxide layer carries heavily doped polycrystalline layers, including an electric contact layer, a screening layer and a connecting layer. The connecting layer electrically connects the screening layer to the epitaxial layer, through the electric contact layer. The screening layer prevents the occurrence of inversion and parasite components in the epitaxial layer between the base regions. The polycrystalline layer arrangement is simple and can be produced in a common process step. The arrangement is able to withstand high temperatures and enables the second insulating layer to be readily applied.

4 Claims, 4 Drawing Sheets

INTEGRATED CIRCUIT SCREEN ARRANGEMENT AND A METHOD FOR ITS MANUFACTURE

BACKGROUND

The present invention relates to an integrated circuit arrangement comprising a semiconductor layer which is doped with ions of desired polarity, mutually spaced component regions in the semiconductor layer surface, of which at least two regions are doped with ions of opposite polarity to the semiconductor layer, a first insulating semiconductor oxide layer on the semiconductor layer having cut-outs for electric connection to the semiconductor layer, and layers of polycrystalline semiconductor material on the semiconductor oxide layer, wherein the integrated circuit is intended for connection to a voltage which is greater than a field threshold voltage so as to cause charge inversion to occur in the semiconductor layer. The invention also relates to a method for producing the arrangement.

The risk that so-called parasite components will occur in integrated semiconductor circuits is often present. An example of a so-called parasite component is the parasite-MOS transistor (Metal Oxide Semiconductor) which occurs between the base regions of two bipolar transistors. The integrated circuit is built on a semiconductor substrate and includes an epitaxial layer in which the base regions are diffused. The base regions are spaced so wide apart as to normally prevent the two bipolar transistors from disturbing one another. Several other layers are found on the epitaxial layer, for instance an insulating first oxide layer which lies immediately on the epitaxial layer, electrical connections and an electrically insulating protective layer which forms the uppermost layer of the composite structure. This protective layer may become covered with an undesirable film of moisture, which is electrically conductive and connected, for instance, to a terminal voltage of the integrated circuit. The moisture film functions as a gate and lies on the potential of the terminal voltage and attracts charges in the epitaxial layer between the base regions, so-called inversion, therewith creating the aforesaid parasite-MOS transistor. In order for inversion to take place, it is necessary for the potential of the moisture film to exceed a field threshold voltage. The problem of parasite-MOS transistors can be avoided relatively easily in the case of integrated circuits which are intended for low voltages, for instance memory circuits in computers with terminal voltages about 5 volts. In such integrated circuits, inversion can be counteracted in a known manner, by raising the field threshold voltage with the aid of an additional diffusion or implantation.

In the case of circuits which are intended for high supply voltages, this method requires wide spacing between the diffusion which raises the threshold voltage and, for instance, a base diffusion, in order not to degrade the breakdown voltage of the transistor. Another known alternative involves the use of a metal screen. The metal screen is connected to the potential of the epitaxial layer and prevents parasitic inversion from taking place beneath the screen. The drawback with this method lies in the difficulty experienced in running the metal conductors and connecting these conductors to peripheral components. The conductor layout and the screens are effected with one and the same metal layer and it is difficult to avoid short circuiting. One known solution involves the use of two metal layers, one for the screens and one for the conductor lay-out. This solution, however, renders the manufacturing process much more complicated and much more expensive, because it is necessary to introduce an additional process and masking step. The oxide layer which needs to be deposited on the first metal layer as an electrical insulation against the second metal layer constitutes a particular problem. The metallization cannot withstand high temperatures and it is necessary for the oxide layer to cover the topography of the disk uniformly in order to enable a good second metallization to be achieved. The lower the highest temperature available, the more difficult this is to achieve.

Other layers additional to the metal screen are often applied to the first oxide layer. One example of this is a polycrystalline layer around the base of a transistor, this layer forming a screen which prevents an electrical breakdown at the base edges. The polycrystalline layer and the metal screen are applied in separate process steps with the aid of separate masks and these process steps are relatively expensive. One such polycrystalline base screen is found described in more detail in Revue De Physique Appliquée, Tome 13, Décembre 1978, M. Roche: "An Advanced Processing Technology for High Voltage Bipolar IC's". In this case, the screen is connected through a metallic connection to a potential which is positive in relation to the potential of the epitaxial layer. Another example of a polycrystalline layer is found described in IEEE Transactions on Electron Devices, Vol. 36, No. 9, September 1989, Denny Duan-Lee Tang et al: "The Design and Electrical Characteristics of High-Performance Single-Poly Ion Implanted Bipolar Transistors". In this article, the polycrystalline layer referred to forms an emitter contact for a transistor.

SUMMARY

The aforedescribed drawbacks are avoided when practicing the invention in that the screen between the base regions, the electrical connection to the epitaxial layer and the electrical connection between the screen and the epitaxial-layer connection comprise heavily doped, polycrystalline semiconductor layers on the insulating oxide layer. The oxide layer also carries electrical resistors and capacitor coatings which consist of doped polycrystalline layers. The polycrystalline layers can be applied in a few mutually common method steps and are relatively resistant to temperature. This temperature resistance enables the method to be simplified when the polycrystalline layers are coated with insulating semiconductor layers.

BRIEF DESCRIPTION OF THE DRAWINGS

An exemplifying embodiment of the invention will now be described in more detail with reference to the accompanying drawings, in which.

DETAILED DESCRIPTION

Figure 1:
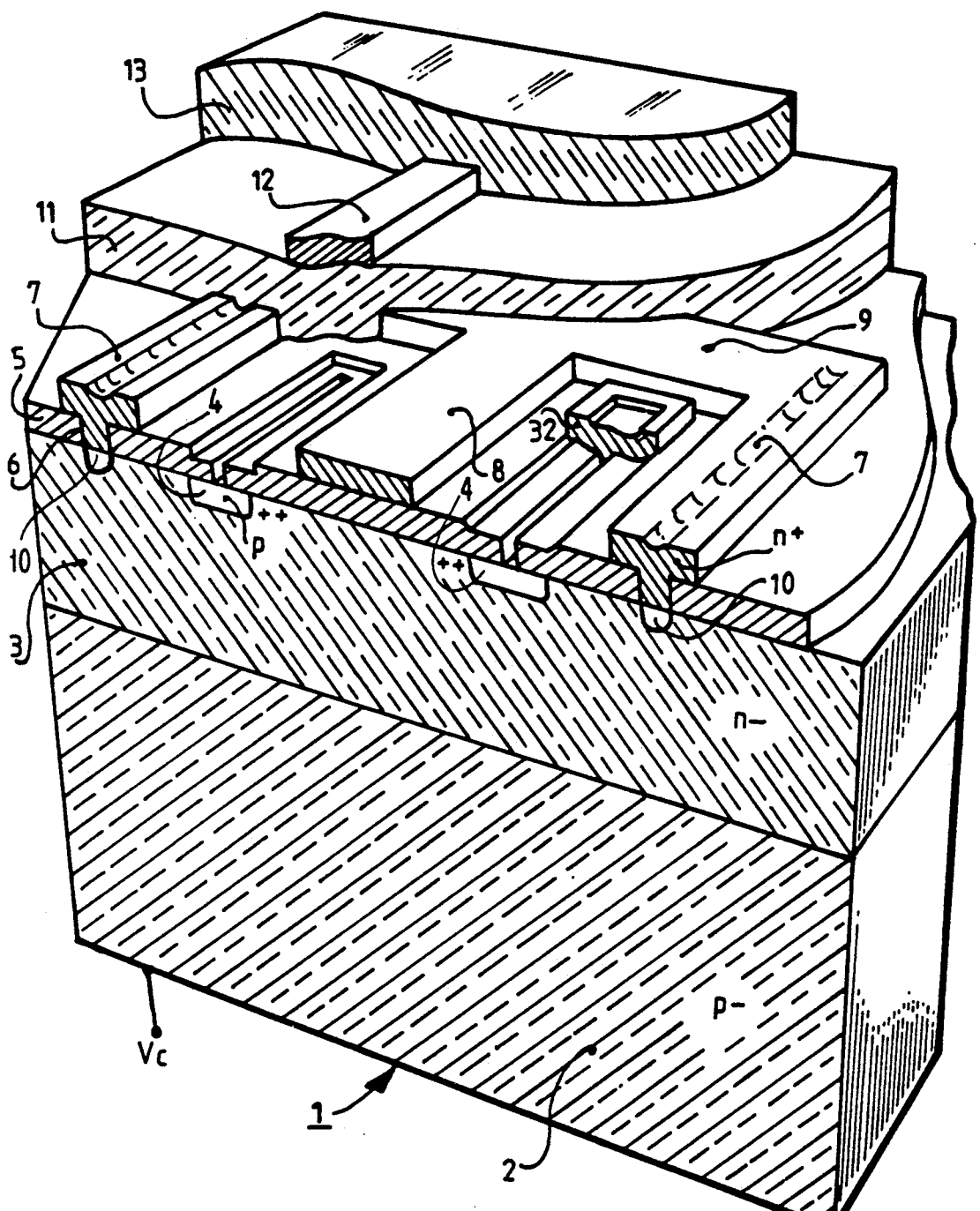
FIG. 1 is a perspective, cross-sectional view of an integrated circuit.

FIG. 1 is a perspective, cross-sectional view of a preferred embodiment of the invention. An integrated circuit 1 includes, in a known manner, a semiconductive substrate 2, which in the illustrated embodiment is a weakly positive p⁻ doped silicon plate. The silicon plate carries a weakly negative n⁻ doped epitaxial silicon layer 3. Located in the surface of the epitaxial layer are two positively doped and mutually spaced component regions 4. In this embodiment, the component regions form two separate bipolar transistors, which have not been shown in detail in the Figure for the sake of clarity but which have their collectors formed in the epitaxial layer 3. Located on the epitaxial layer 3 is a first insulating silicon-dioxide layer 5 which presents cut-out 6 through which electric connection with the epitaxial layer 3 are made. The first silicon-dioxide layer 5 carries layers of polycrystalline silicon, which in accordance with the invention include an electric contact layer 7, a screen layer 8 and a connecting layer 9. The electrical contact layer 7 extends into the cut-out 6 and is formed on the oxide layer 5 in the close proximity of the cut-out. The screen layer 8 extends in a region which is located between the base regions 4 and is connected electrically to the electrical contact layer 7 through the connecting layer 9. This layer extends between the layer 7 and the screen layer 8 in a region which is spaced from the base regions 4, as shown in the Figure. The three polycrystalline layers 7, 8 and 9 are heavily negatively n+-doped and are electrically conductive. The heavy n+ -doping extends down to the epitaxial layer 3 through the cut-out 6 and down to the regions 10, which form an electrical connection with the collectors of the bipolar transistors and also form a means for connecting the screen layer 8 electrically to the epitaxial layer 3. The first silicon-dioxide layer 5 and the polycrystalline layers 7, 8 and 9 are covered by a second silicon-dioxide layer 11. This layer forms an electrical insulation against other electrical conductors in the integrated circuit 1, for instance a metallic conductor 12. The second silicon-dioxide layer 11 is covered by a protective layer 13, for instance a silicon-dioxide layer.

As mentioned in the introduction, it is possible that the surface of the protective layer 13 will become electrically conductive, for instance by the formation of a film of moisture thereon. This film may possibly be connected with a voltage connected to the integrated circuit 1, for instance a collector voltage $V_c$ for the bipolar transistors of a magnitude of −90 volts. The connection to the moisture film is able to extend via the edges of the integrated circuit or via the capsule in which the circuit is encapsulated. The film of moisture present on the surface of the protective layer 13 assumes a potential in the proximity of $V_c$ and attracts positive charges in the epitaxial layer 3, the aforesaid inversion. This has been marked in FIG. 1 with the sign + at the base regions 4. The screen layer 8 prevents the attraction of charges beneath this layer, which has the same potential as the epitaxial layer 3. When no screen layer 8 is present, a continuous region of positive charges is formed between the base regions 4. This results in the aforesaid undesirable parasite MOS-transistor, which is in its conductive state. As before mentioned, in order for inversion to occur, it is necessary for the voltage $V_c$ for which the integrated circuit is intended to exceed a threshold voltage for the epitaxial layer 3.

Figure 2:
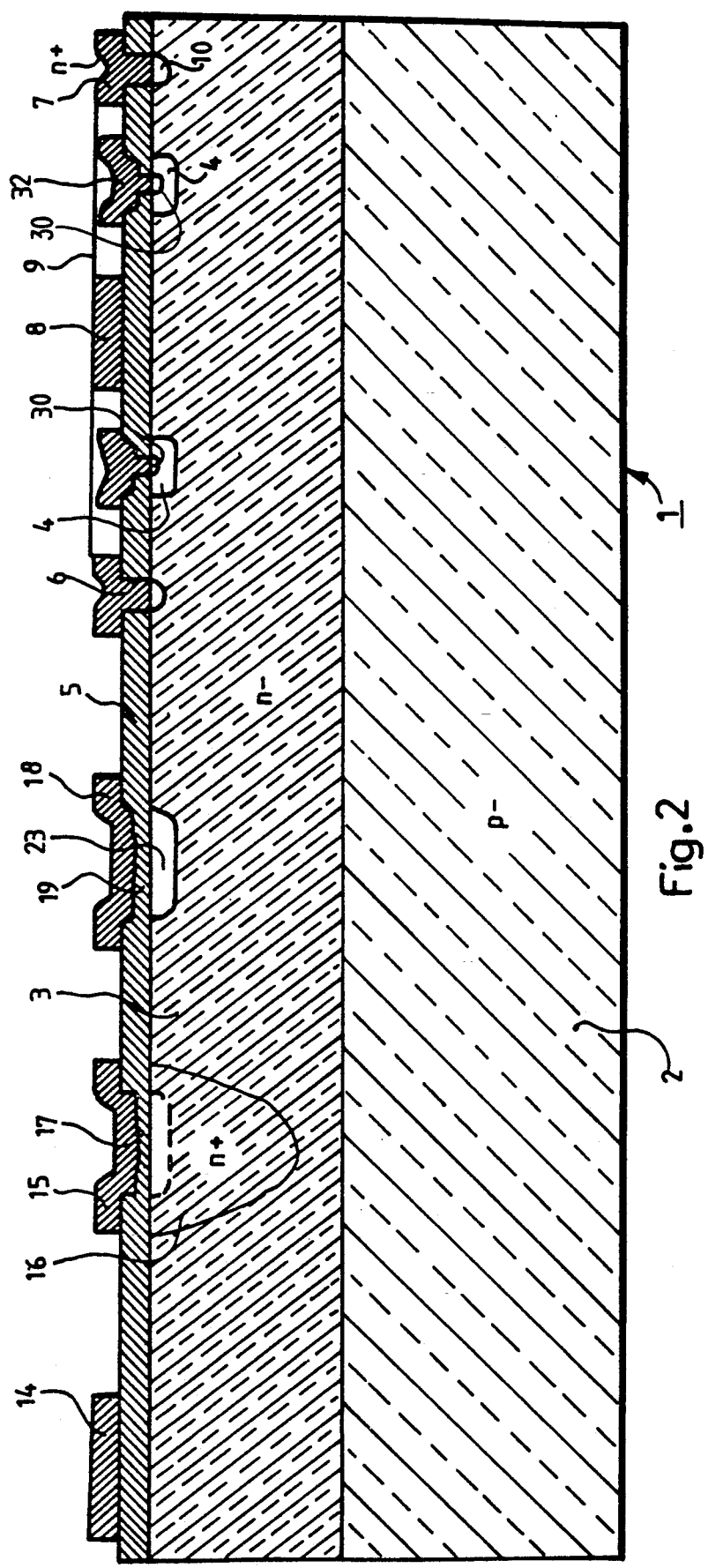
FIG. 2 is a cross-sectional view of an alternative integrated circuit.

An alternative embodiment of the invention is illustrated in cross-section in FIG. 2. The epitaxial layer 3 lies on the silicon substrate 2 and carries the insulating silicon-dioxide layer 5. As described with reference to FIG. 1, the surface of the epitaxial layer carries the component regions 4 and the oxide layer 5 has cut-out 6 formed therein for the electrical contact layers 7. The screen layer 8 extends on the oxide layer 5 in the region between said component regions 4. The screen layer 8 and the electrical contact layer 7 are mutually connected through the connecting layer 9. According to this alternative embodiment, the oxide layer 5 carries further layers of polycrystalline silicon. Of these layers, one is a resistance layer 14 doped with ions of desired polarity to a desired degree of doping and forms an electrical resistor in the integrated circuit 1. A capacitor layer 15 is heavily doped and forms the one conductive coating of a first capacitor. This capacitor has a second conductive coating which forms a heavily and negatively n+-doped region 16 in the epitaxial layer 3. The dielectric 17 of the capacitor consists of silicon dioxide. A second capacitor has a conductive coating 18 of heavily doped polycrystalline silicon, a dielectric 19 and a further coating which forms a positively p-doped region in the epitaxial layer 3. According to one advantageous embodiment of the invention, the polycrystalline layers 7, 8, 9, 14, 15 and 18 form parts of a common polycrystalline layer. This layer is applied to the oxide layer 5 by means of a method described hereinafter with reference to FIGS. 3–8.

Figure 3:
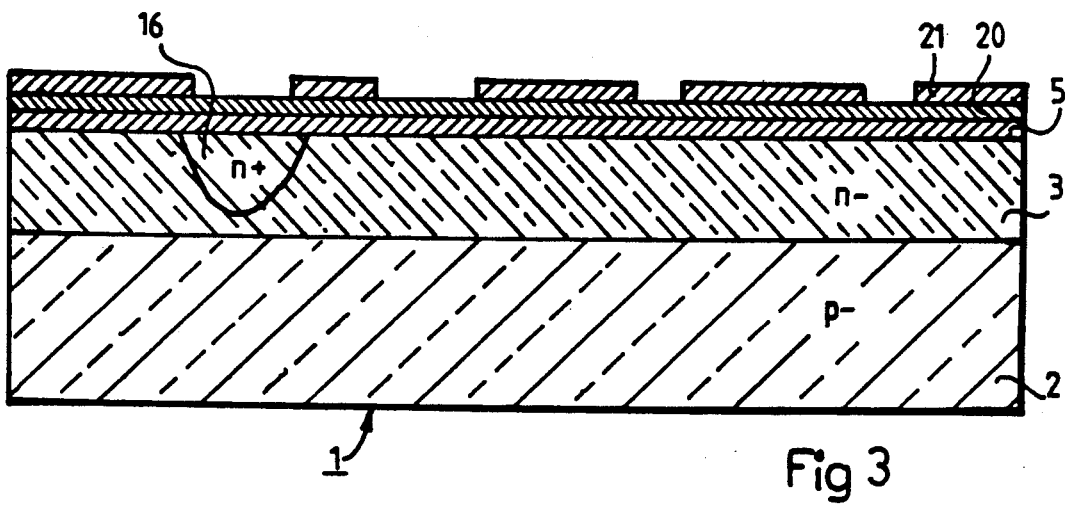
FIGS. 3–8 illustrate in cross-section the different method steps of producing the arrangement illustrated in FIGS. 1 and 2.
Figure 4:
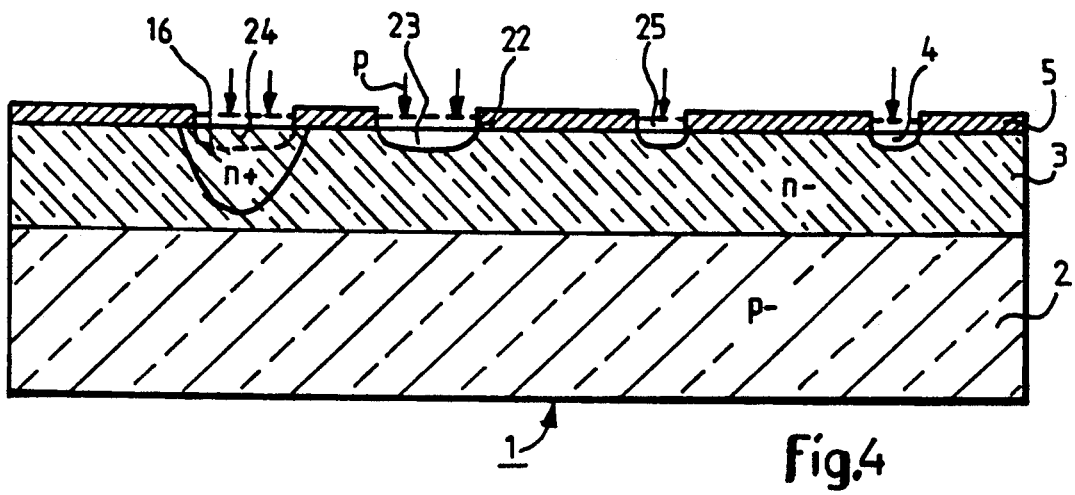
Figure 5:
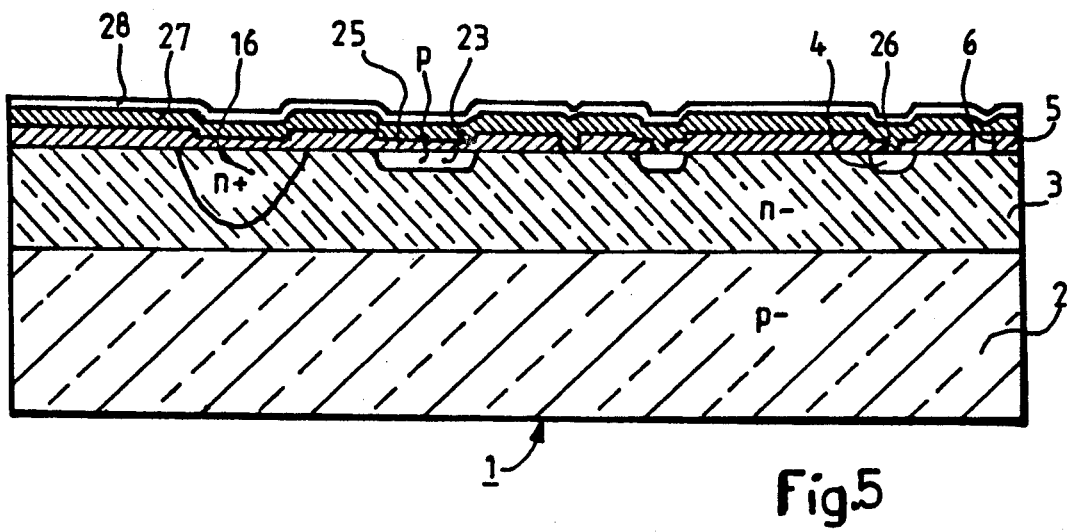
Figure 6:
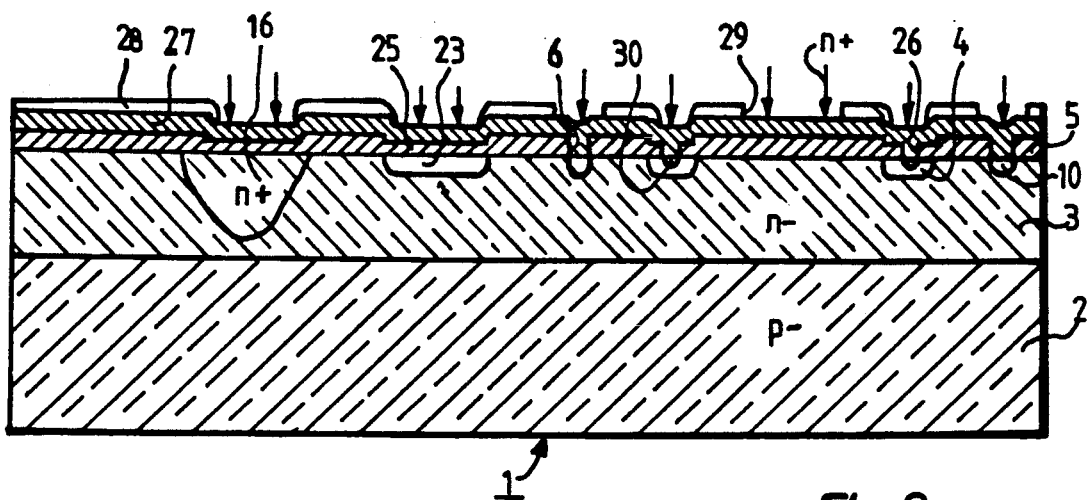
Figure 7:
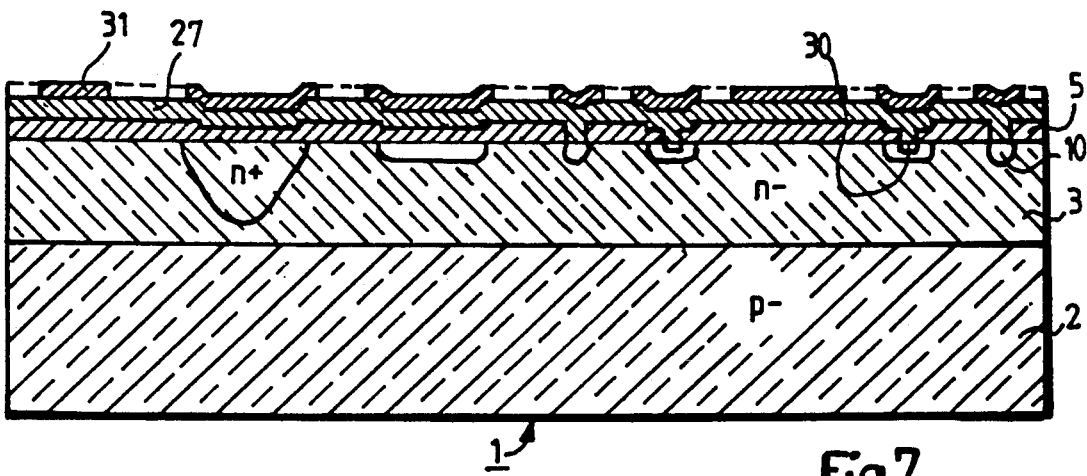
Figure 8:
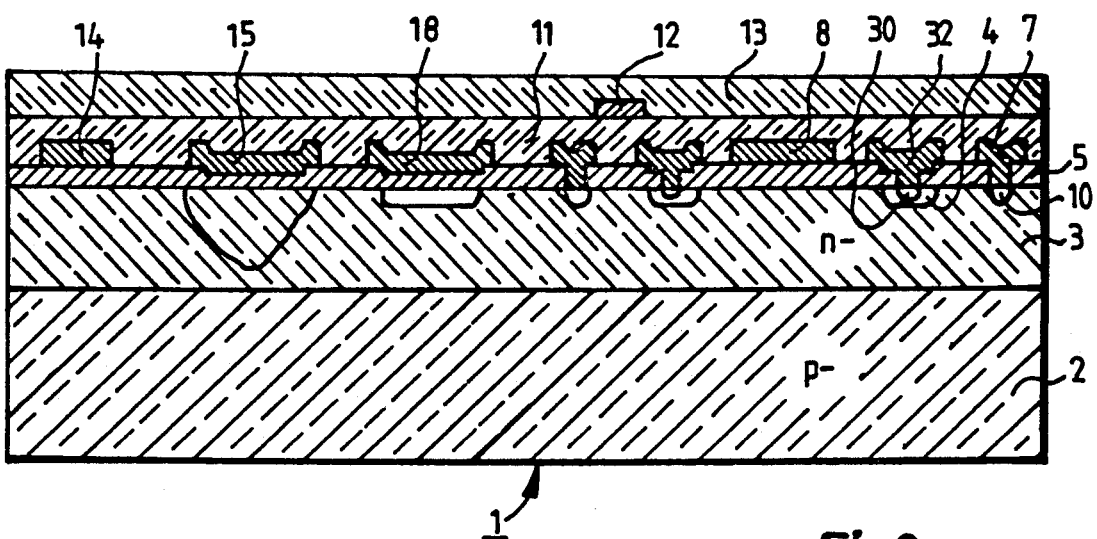

FIG. 3 illustrates the weakly and positively doped silicon substrate 2, on which the weakly negatively doped epitaxial silicon layer 3 is grown in a known manner. The regions in the substrate 2 can be doped prior to growing the epitaxial silicon layer 3, although such forms no part of the present invention and is therefore not shown in the Figures. The regions are heavily doped in the epitaxial layer 3 with the aid of masks, not shown in detail. One example in this regard is the region 16, which has been doped heavily negative n+ in order to form a part of a capacitor in the integrated circuit 1. The first oxide layer 5, which has a thickness of 9000 Å, is applied to the epitaxial layer, for instance by oxidizing said layer on the surface of the epitaxial layer. Holes are formed in the oxide layer 5 with the aid of a masking procedure which includes several part stages. A layer 20 of photoresistive material is applied to the oxide layer 5, whereafter a photographic component mask 21 is applied on the upper surface of the layer 20. This photoresistive layer 20 is exposed and developed in the openings of the mask 21, whereafter the mask and the developed photoresistive 20 are removed and windows 22 are etched in the oxide layer 5. The residue of the photoresistive layer 20 is then removed, as illustrated in FIG. 4. The component regions 4 and the regions 23 and 24 are then doped with positive ions p through the windows 22, either by diffusion or by ion implantation. Other parts of the epitaxial layer 3 are protected against this doping of the oxide layer 5. This positive doping is much weaker than the preceding negative doping of the region 16, and the whole of the region 16 remains negatively doped. Doping through the windows 22 is effected in an oxidizing atmosphere, such as to grow oxide layers 25 to a thickness of about 3000 Å on the epitaxial layer 3 in the windows 22 during the doping process. This is illustrated in FIG. 4 by broken lines in the windows. The cut-outs 6 are etched in the oxide layer 5 and also electrical conduct holes 26 are formed through the oxide layer 25 and down to the component regions 4 by a renewed masking process using an etching mask, as illustrated in FIG. 5. A polycrystalline silicon layer 27 is deposited over the whole of the integrated circuit 1 and this surface is oxidized to form a diffusion-blocking layer 28. Windows 29 are opened in the oxide layer 28, by means of a photolithographic masking method, as described above and as illustrated in FIG. 6. According to this example, the windows are formed over the capacitor regions 16 and 23 and the component regions 4, and also over the electrical contact layer 7, the screen layer 8 and the connecting layer 9, as illustrated in FIG. 1. The polycrystalline layer 27 is heavily doped in the windows 29, by diffusion of negative n+-ions. The negative ions penetrate down into the epitaxial layer 3 in those regions in the windows 29 where no oxide layer 5 or 25 is present, i.e. in the cut-outs 6 and the holes 26. This provides emitter connections 30 to the component regions 4 and connections to the epitaxial layer 3, via the regions 10. The whole of the oxide layer 28 is etched away and the whole of the polycrystalline layer 27 is doped with ions of desired polarity, for instance by ion implantation. The resistance of those parts of the layer 27 which are covered by the oxide layer 28 with the heavily negative n+-doping is determined in this way. The heavy n+-doping is influenced to a very small extent by the ion implantation. Those regions of the polycrystalline layer 27 which are to be retained are defined with a mask 31 in a further photolithographic masking method, as illustrated in FIG. 7. Those parts of the polycrystalline layer 27 which are exposed between the parts of the mask 31 are etched away so as to leave the electrical contact layer 7, the screen layer 8, the connecting layer 9, the resistance layer 14 and the capacitor coatings 15 and 18, as illustrated in FIG. 2. Polycrystalline contact layers 32 for the emitter diffusions 30 in the component regions 4 are also left by the layer 27, as illustrated in FIG. 8. It should be noted that if no resistance layer 14 is desired, the oxide layer 28 can be omitted from the method and the whole of the polycrystalline layer 27 is doped heavily negative n+. As before mentioned, the contact layers 32 have only been indicated schematically in FIG. 1. A second silicon-dioxide layer 11 is deposited on the silicon-dioxide layer 5 and the polycrystalline layers. Holes for electrical connections are etched in the layer 11 by means of a photolithographic masking process, not shown in detail in the Figures. A metallic layer is deposited over the layer 11 and a pattern of metal conductors is etched with the aid of a photolithographic masking process, of which conductors the conductor 12 is shown in FIG. 8. The silicon-dioxide protective layer 13 is applied over the layer 11 and the metal conductors. Holes are formed in the protective layer 13 by means of a photolithographic masking process, not shown. The metallic conductors can be reached through these holes, in order to connect these conductors electrically to external connections of a capsule (not shown) encapsulating the integrated circuit 1, with the aid of conductive wires.

The aforedescribed integrated circuit 1 is produced from silicon, although it will be understood that other semiconductive materials can be used, such as gallium arsenide, for instance. The type of doping to which, for instance, the substrate 2 and the epitaxial layer 3 are subjected can be chosen in a manner well known to the skilled person. Although the invention has been described with reference to an embodiment in which the epitaxial layer 3 lies on the substrate 2, this is not a prerequisite of the invention, since the invention can be practiced, for instance, directly on the substrate 2 or on a semiconductor layer which is isolated electrically on its undersurface by a dielectric.

The described method in which the polycrystalline layer 27 is utilized for several integrated circuit functions affords several advantages. For instance, in comparison with known methods, one or more photolithographic masking steps can be avoided and the electrical connection of the screen 8 can be simplified. The method also affords other circuit connection and surface-saving advantages, although the polycrystalline layer and the components of the circuit 1 must be spaced apart sufficiently to prevent the breakdown voltage of the components from having a negative influence. This is due to the fact that the aforesaid parts of the polycrystalline layer are connected to the potential of the epitaxial layer. This connection, however, assists in keeping the breakdown voltage within those regions where a metallic conductor of disadvantageous potential crosses a heavily doped region in the epitaxial layer, for instance the region 10 in FIG. 1. The connection region 7 extends laterally beyond the region 10 and forms a screen which lies on the potential of the epitaxial layer 3. This screen functions to screen a disadvantage potential of the conductor 12 and maintains the breakdown voltage of the region 10.

What is claimed is:

1. An integrated circuit screen arrangement comprising
    a semiconductor layer which is doped with ions of a desired polarity,
    a plurality of mutually spaced component regions in the semiconductor layer surface, of which at least two regions are doped with ions of polarity opposite to the desired polarity,
    a first insulating semiconductor oxide layer on the semiconductor layer having cut-outs for electric connection to the semiconductor layer, and
    a plurality of layers of polycrystalline semiconductor material disposed on the semiconductor oxide layer, wherein the polycrystalline semiconductor material layers include
    an electric contact layer which is heavily doped with ions of the desired polarity and which extends in the cut-outs for electrical connection;
    a screen layer which is heavily doped with ions of the desired polarity, said screen layer extending in a region between the aforesaid at least two component regions; and
    a connecting layer which is heavily doped with ions of the desired polarity and which extends between the electric contact layer and the screen layer and connects these layers together electrically, wherein the screen layer screens electrically a region in the semiconductor layer against the influence of a non-desired electrical potential on an upper surface of the integrated circuit.

2. An arrangement according to claim 1, wherein the plurality of layers of polycrystalline semiconductor material further include at least one resistance layer which is doped with ions of the desired polarity to a desired doping degree and which forms an electric resistor of the integrated circuit.

3. An arrangement according to claim 1, wherein the plurality of layers of polycrystalline semiconductor material further include at least one capacitor layer which is heavily doped with ions of the desired polarity and which forms an electrically conductive coating of a capacitor of the integrated circuit.

4. An arrangement according to claim 1, wherein the plurality of layers of polycrystalline semiconductor material form parts of a common polycrystalline semiconductor layer which has been disposed on the first insulating semiconductor oxide layer.

* * * * *